United States Patent
Bailey

[11] Patent Number: 6,156,450
[45] Date of Patent: Dec. 5, 2000

[54] BATTERY TESTER HAVING PRINTED ELECTRONIC COMPONENTS

[75] Inventor: John C. Bailey, Columbia Station, Ohio

[73] Assignee: Eveready Battery Company, Inc., St. Louis, Mo.

[21] Appl. No.: 08/900,037

[22] Filed: Jul. 24, 1997

[51] Int. Cl.⁷ .............................. H01M 2/20; H01M 6/40
[52] U.S. Cl. .............................. 429/93; 429/92; 429/122; 429/124
[58] Field of Search ................................ 429/93, 122, 124

[56] References Cited

U.S. PATENT DOCUMENTS

| | | |
|---|---|---|
| 3,667,039 | 5/1972 | Garfein et al. |
| 3,926,676 | 12/1975 | Frie et al. ................................. 136/86 |
| 3,968,639 | 7/1976 | Berets et al. |
| 4,027,231 | 5/1977 | Lohrmann. |
| 4,173,733 | 11/1979 | Sugalski et al. |
| 4,248,942 | 2/1981 | Eby et al. |
| 4,371,827 | 2/1983 | Mullersman et al. |
| 4,379,816 | 4/1983 | Mullersman et al. |
| 4,392,102 | 7/1983 | Sugalski et al. |
| 4,520,353 | 5/1985 | McAuliffe. |
| 4,536,757 | 8/1985 | Ijntema. |
| 4,560,937 | 12/1985 | Finger. |
| 4,626,765 | 12/1986 | Tanaka. |
| 4,680,527 | 7/1987 | Benenati et al. |
| 4,702,563 | 10/1987 | Parker. |

(List continued on next page.)

FOREIGN PATENT DOCUMENTS

| | | |
|---|---|---|
| 495636A2 | 7/1992 | European Pat. Off. |
| 501609 | 9/1992 | European Pat. Off. |
| 495636A3 | 3/1994 | European Pat. Off. |
| 0690457 | 1/1996 | European Pat. Off. |
| 57-153275 | 9/1982 | Japan. |
| 61-186872 | 8/1986 | Japan. |
| 62-264028 | 11/1987 | Japan. |
| 7211358 | 8/1995 | Japan. |
| 8185895 | 7/1996 | Japan ............................ H01M 10/48 |
| 8234160 | 9/1996 | Japan. |

(List continued on next page.)

OTHER PUBLICATIONS

Robert Parker, "Solid State RMS Recording Ammeter," Lawrence Livermore Laboratory, University of California, 1972.

Carl M. Lampert et al., "Large–Area Chromogencies: Materials and Devices for Transmittance Control," *SPIE Institutes for Advanced Optical Technologies*, vol. IS 4, 1988.

Francis Garnier et al., "All–Polymer Field–Effect Transistor Realized by Printing Techniques," *Science*, vol. 265, Sep. 16, 1994, pp. 1684–1686.

A.R. Brown et al., "Logic Gates Made from Polymer Transistors and Their Use in Ring Oscillators," *Science*, vol. 270, Nov. 10, 1995, pp. 972–974.

*Primary Examiner*—Carol Chaney
*Assistant Examiner*—Mark Ruthkosky
*Attorney, Agent, or Firm*—Russell H. Toye, Jr.

[57] ABSTRACT

The battery testing circuit of the present invention preferably includes a substrate, a display printed on the substrate for displaying a level of discharge of a battery, a display driver circuit coupled to the display and to the battery for receiving power from the battery to drive the display, and a battery discharge level sensing circuit coupled to the display and to the battery for sensing a discharge level of the battery and for supplying a display signal representing the sensed discharge level to the display. At least one of the circuits is printed on the substrate using processable conductive polymer materials as ink layers. Preferably, the battery discharge level sensing circuit component continuously senses the discharge level and the display continuously displays the discharge level. The display is preferably a field-responsive liquid crystal display made of either polymer liquid crystal or polymer dispersed liquid crystal material. The display may be formed of one or more layers of active liquid crystal material. The display driver circuit is preferably an oscillator that may also be printed on the substrate.

42 Claims, 4 Drawing Sheets

6,156,450

U.S. PATENT DOCUMENTS

| Patent No. | Date | Inventor | Class |
|---|---|---|---|
| 4,702,564 | 10/1987 | Parker . | |
| 4,723,656 | 2/1988 | Kiernan et al. . | |
| 4,726,661 | 2/1988 | Parker . | |
| 4,835,475 | 5/1989 | Hanakura et al. . | |
| 4,835,476 | 5/1989 | Kurosawa et al. . | |
| 4,876,632 | 10/1989 | Osterhout et al. . | |
| 4,877,310 | 10/1989 | Seachman et al. . | |
| 4,877,858 | 10/1989 | Hachiya et al. . | |
| 5,015,544 | 5/1991 | Burroughs et al. . | |
| 5,059,895 | 10/1991 | Cataldi et al. . | |
| 5,111,316 | 5/1992 | Nobilke et al. | 359/52 |
| 5,130,658 | 7/1992 | Bohmer . | |
| 5,156,931 | 10/1992 | Burroughs et al. . | |
| 5,188,231 | 2/1993 | Kivell et al. . | |
| 5,196,144 | 3/1993 | Smith et al. . | |
| 5,223,003 | 6/1993 | Tucholski et al. | 29/623.4 |
| 5,232,631 | 8/1993 | Cao et al. . | |
| 5,351,143 | 9/1994 | Sato et al. . | |
| 5,355,089 | 10/1994 | Treger . | |
| 5,389,470 | 2/1995 | Parker et al. . | |
| 5,393,618 | 2/1995 | Weiss et al. . | |
| 5,396,177 | 3/1995 | Kuo et al. . | |
| 5,409,788 | 4/1995 | Weiss et al. . | |
| 5,418,085 | 5/1995 | Huhndorff et al. . | |
| 5,418,086 | 5/1995 | Bailey . | |
| 5,458,992 | 10/1995 | Bailey | 429/93 |
| 5,460,902 | 10/1995 | Parker et al. . | |
| 5,478,665 | 12/1995 | Burroughs et al. . | |
| 5,491,420 | 2/1996 | Parker . | |
| 5,494,496 | 2/1996 | Huhndorff et al. . | |
| 5,525,439 | 6/1996 | Huhndorff et al. . | |
| 5,538,806 | 7/1996 | Weiss et al. . | |
| 5,568,294 | 10/1996 | Lee | 359/73 |
| 5,570,211 | 10/1996 | Hanaoka et al. | 359/53 |
| 5,578,390 | 11/1996 | Hughen . | |
| 5,592,095 | 1/1997 | Meadows | 324/436 |
| 5,604,049 | 2/1997 | Weiss et al. | 429/93 |
| 5,610,511 | 3/1997 | Parker | 324/106 |
| 5,626,795 | 5/1997 | Smith et al. . | |
| 5,626,978 | 5/1997 | Weiss et al. . | |
| 5,654,640 | 8/1997 | Bailey . | |
| 5,667,538 | 9/1997 | Bailey | 29/623.5 |
| 5,738,934 | 4/1998 | Jones . | |
| 5,760,588 | 6/1998 | Bailey | 324/435 |
| 5,780,572 | 7/1998 | Graham . | |
| 5,790,215 | 8/1998 | Sugahara et al. . | |
| 5,796,447 | 8/1998 | Okumura et al. | 349/33 |

FOREIGN PATENT DOCUMENTS

| | | |
|---|---|---|
| 9-80488 | 3/1997 | Japan . |
| 9200966 | 7/1997 | Japan . |
| 8802128 | 3/1988 | WIPO . |
| 9306474 | 4/1993 | WIPO . |
| 9314436 | 7/1993 | WIPO . |
| 9628756 | 9/1996 | WIPO . |

BATTERY TESTER HAVING PRINTED ELECTRONIC COMPONENTS

BACKGROUND OF THE INVENTION

The present invention generally relates to liquid crystal displays and battery tester circuits, and more particularly to battery tester circuits of the type that may be printed on a battery label.

Battery tester circuits exist that may be printed on a battery label. Such existing battery tester circuits are typically either "thermochromic" testers or "electrochromic" testers. Thermochromic testers include a calibrated resistor that is selectively coupled to the opposite poles of the battery through a switch that may be provided at either or both ends of the calibrated resistor. A thermochromic ink is printed over the resistor that responds to changes in temperature of the calibrated resistor to gradually change between opaque and transparent states and thereby enable indicia printed under the thermochromic layer to be viewed or blocked based upon the temperature of the calibrated resistor. Alternatively, the thermochromic layer may change colors in response to the temperature of the calibrated resistor. The temperature of the calibrated resistor is determined by the power which the battery can deliver, which is a function of both the voltage and internal resistance of the battery. The accuracy of a thermochromic tester is determined by not only the rate of change of the open circuit voltage and internal resistance (rate of change of the battery's ability to produce power), but also the sharpness of the color change in the thermochromic ink (the number of degrees of temperature change required to make the thermochromic ink change color). Thus, the thermochromic ink layer functions both as a display and temperature sensor.

Electrochromic testers differ from thermochromic testers in that the display layer changes color directly in response to the "open circuit voltage" of the battery. The accuracy of an electrochromic tester is determined by the rate of change of the open circuit voltage of the battery with depth of discharge and the sharpness of the change of intensity of the electrochromic display with voltage. Thus, like the thermochromic tester, the electrochromic tester display functions both as a display and a voltage sensor and the accuracy of the tester may be limited by the voltage response of the display.

Since the accuracy of these thermochromic and electrochromic testers is limited by the response of the display, it has been proposed to improve tester accuracy by including a voltage-responsive electronic component, such as a Zener diode or transistor and to thus limit the function of the display to that of a display. Such an approach is disclosed in U.S. Pat. Nos. 5,610,511, 5,460,902, and 5,389,470. In these patents, a tester circuit is disclosed that utilizes discrete electronic components to discriminate between various discharge levels and to selectively activate different segments of a thermochromic display. Thus, these tester circuits provide discrete displays for the various discharge levels that may be discriminated by the separate sensing circuit thereby limiting the function of the display to that of a display. However, because the testers disclosed in these patents utilize discrete electronic components manufactured using conventional semiconductor technology, the electronic components are not small enough to be included in the label of a battery. Further, because the exterior dimensions of batteries are strictly limited by the ANSI standards, such electronic components cannot be provided on the exterior surface of the battery. If such electronic components were to be provided in the interior of the battery, the space occupied by the electronic components would reduce the space in which the active battery ingredients are provided thereby reducing the service life of the battery. For these reasons, the use of a separate voltage discrimination circuit for an on-label tester has not been commercially implemented.

Another problem associated with thermochromic and electrochromic testers concerns the amount of power consumed by these testers. Because these testers consume relatively significant levels of power, switches are provided to enable selective activation of the testers without requiring a constant drain on the battery. Because of the requirement for such switches, however, the displays do not continuously display the current discharge level of the battery.

Although general purpose electric field-responsive liquid crystal displays are known, they are too expensive to include on a battery label and they require activation voltage levels well in excess of the open circuit voltage of most batteries. Further, these liquid crystal displays tend to irreversibly polarize when driven using a direct current (DC) driving signal. For these reasons, field-responsive liquid crystal displays have been considered to be unsuitable for use in an on-label battery tester.

SUMMARY OF THE INVENTION

Accordingly, it is an aspect of the present invention to solve the above problems and to provide a battery testing circuit having a display that requires significantly lower levels of power such that it may be continuously used to display the discharge level of the battery. It is another aspect of the present invention to provide a battery tester circuit that includes a separate discharge level discriminating circuit that may be printed directly on the battery label with the display. Another aspect of the present invention is to provide an improved liquid crystal display that may be printed on a battery label or housing. Yet another aspect of the present invention is to provide a more accurate battery tester.

To achieve these and other aspects and advantages, the battery testing circuit of the present invention comprises a substrate, a display printed on the substrate for displaying a level of discharge of a battery, a display driver circuit coupled to the display and to the battery for receiving power from the battery to drive the display, and a battery discharge level sensing circuit coupled to the display and to the battery for sensing a discharge level of the battery and for supplying a display signal representing the sensed discharge level to the display. At least one of the circuits is printed on the substrate. Preferably, the battery discharge level sensing circuit component continuously senses the discharge level and the display continuously displays the discharge level. The substrate may be a battery label, a battery pack housing, a flashlight housing, battery packaging material, or a housing of any other device in which batteries are used. The display is preferably a field-responsive liquid crystal display and the display driver circuit is preferably an oscillator that may also be printed on the substrate.

These and other features, advantages, and objects of the present invention will be further understood and appreciated by those skilled in the art by reference to the following specification, claims, and appended drawings.

DETAILED DESCRIPTION OF PREFERRED EMBODIMENTS

Figure 1:
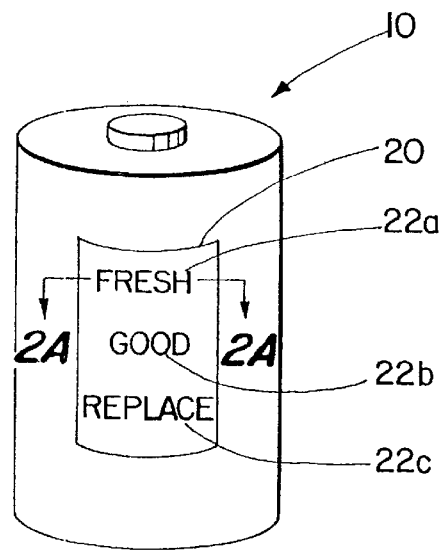
FIG. 1 is a perspective view of the battery incorporating an on-label battery tester constructed in accordance with a first embodiment of the present invention.

FIG. 1 shows a battery 10 having a label 15 incorporating a battery testing circuit constructed in accordance with the present invention. As explained in more detail below, the battery testing circuit includes a display 20 for indicating the relative discharge level of battery 10. Preferably, display 20 is a multi-segmented display having a plurality of segments 22a–22c that may be selectively activated so as to more accurately display the discharge level of battery 10. For example, a first segment 22a may be exposed to indicate "fresh" when the remaining battery capacity is relatively high, a second segment 22b that shows an indication of "good" when the battery discharge level is sufficient for most applications, and a third segment 22c for showing a "replace" indication when the remaining battery capacity is too low for use in most applications.

Although the display is described herein as being provided primarily for use in connection with a battery tester, it will be appreciated that the display may be provided on a battery label to display other information pertaining to the battery. Such information may include advertisements and/or other information or graphics for attracting a consumer's attention. Given that the disclosed display may be continuously left in an ON state, the displayed information may periodically alternate between a graphic advertisement and the battery discharge level, for example. Further, a switch may be provided in the battery label to manually initiate a change in the information displayed.

Figure 2A:
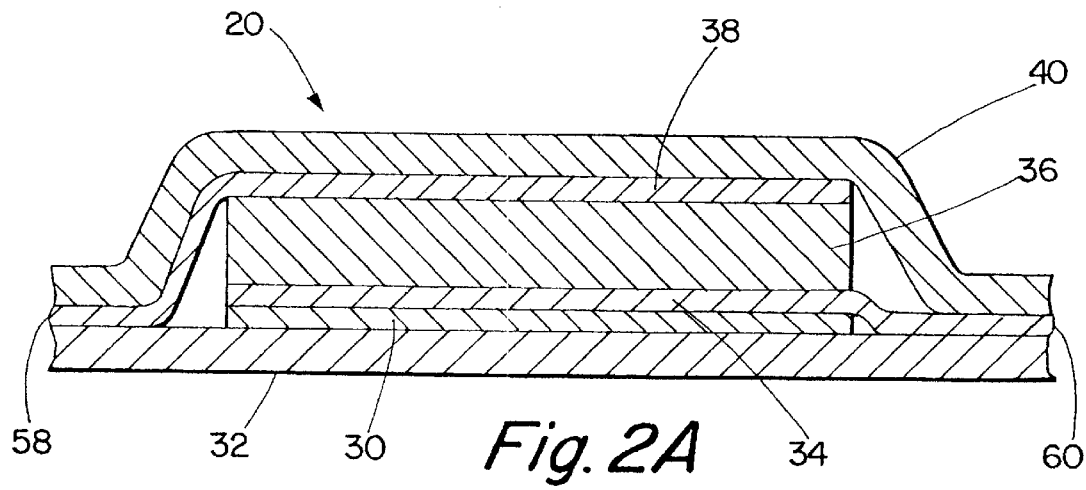
FIG. 2A is a partial cross-sectional view taken along plane 2A—2A of FIG. 1 illustrating a liquid crystal display configuration constructed in accordance with a first variation of the first embodiment of the present invention.
Figure 2B:
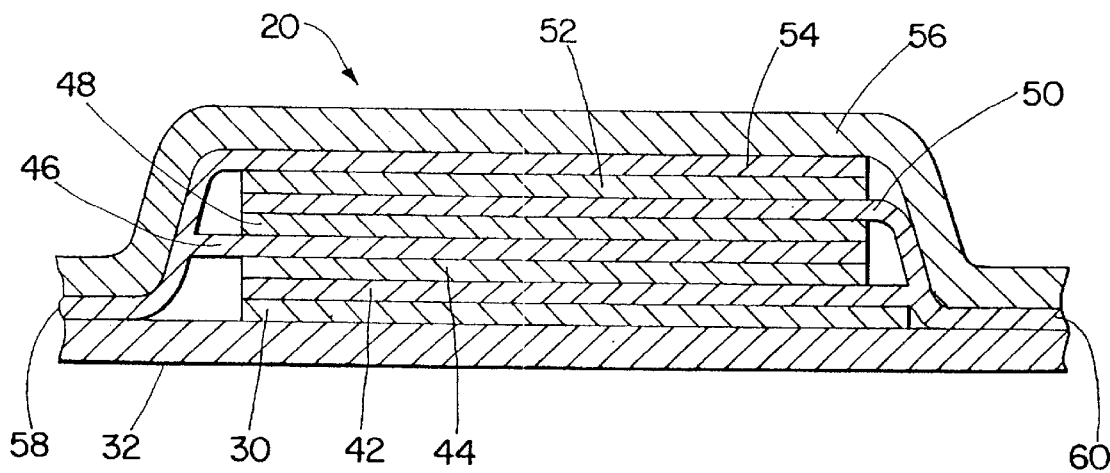
FIG. 2B is a partial cross-sectional view taken along plane 2A—2A of FIG. 1 illustrating a second variation of a liquid crystal display constructed in accordance with the present invention.

In a preferred embodiment of the present invention, display 20 is a liquid crystal display having one of the two structures shown in FIGS. 2A and 2B. Most preferably, display 20 is an electric field-responsive liquid crystal display. An electric field-responsive liquid crystal display includes at least one layer of liquid crystal material that undergoes a change in visual appearance in response to an electric field applied across the layer of liquid crystal material. Such field-responsive liquid crystal displays may, for example, be birefringent or bipolar.

As shown in FIG. 2A, a liquid crystal display 20 may include a graphics layer 30 that may be printed on a label substrate 32 using conventional printing techniques. Label substrate 32 may be a laminated or single-layer structure and is preferably formed of at least one layer of PVC material. Graphics layer 30 may be formed of conventional inks to provide high contrast indications such as "fresh," "good," and "replace." The indications printed in graphics layer 30 may be selectively blocked or made viewable by the selected activation of a corresponding segment (22a–22c) of a liquid crystal material layer 36 provided between a first electrode 34 and a second electrode 38. Separate sets of electrodes 34 and 38 are preferably provided for each display segment 22a–22c. Such segments may be completely isolated from one another or share a common liquid crystal layer. Preferably, first and second electrodes 34 and 38 are formed of a transparent conductive material such as tin-doped indium oxide (ITO) or, more preferably, a much less-expensive solution processable conductive polymer such as dodecylbenzene sulfonic acid doped polyaniline which is dissolved in toluene solution for printing the transparent electrodes on the adjacent layers. Electrodes 34 and 38 may also be formed of thin transparent metal coating formed by vapor deposition or sputtering, or of printing inks that use transparent conductive particles such as tin-doped indium oxide, antimony-doped tin oxide, fluorine doped tin oxide, or zinc oxide.

It will be appreciated by those skilled in the art that the bottom electrode 34 may be reflective rather than transparent. If electrode 34 is reflective, or opaque, graphics layer 30 is preferably formed on top of electrode 34 so that it will be visible through liquid crystal layer 36.

Liquid crystal layer 36 is preferably formed of a polymer liquid crystal (PLC) or polymer-dispersed liquid crystal (PDLC) material that may be printed on an adjacent layer using conventional printing techniques. For a PLC display, polymers with conventional liquid crystal materials are used in place of the liquid crystal materials. Such PLC displays are disclosed in U.S. Pat. No. 5,397,503, the disclosure of which is incorporated herein by reference.

For a PDLC display, the liquid crystal material is isolated either in microcapsules imbedded in a solid polymer matrix or in micelles in a polymer matrix. The polymer matrix is preferably chosen so that the polymer and liquid crystal material have equal refractive indices in the presence of an electric field. When the indices are the same, the material appears clear. When the electric field is removed, the refractive indices become different and the incident light is scattered and the material appears cloudy or black with suitable dye additives. Examples of such birefringent PDLC displays are disclosed in U.S. Pat. Nos. 5,202,063, 5,285,299, and 5,225,104.

Display 20 also preferably includes one or more protective layers 40 made of a transparent material such as PVC or the like. It will be appreciated by those skilled in the art that layers 30, 34, 36, and 38 may be printed first on label substrate 32 and then adhered to protective layer 40 or alternatively may be printed on protective layer 40 in reverse order and then adhered to label substrate 32. Alternative methods of forming this and the other structures disclosed herein will be apparent to those skilled in the art.

FIG. 2B shows an alternative construction for a printed liquid crystal display 20. In this alternative construction, a plurality of thinner liquid crystal layers are used in place of the thicker liquid crystal layer 36 described above in FIG. 2A. By using a plurality of thinner liquid crystal layers, the voltage required to activate and drive the liquid crystal display 20 may be significantly reduced. A plurality of such thinner liquid crystal layers are preferred because the thinner the liquid crystal layer, the less perceptible its change in visual states. In this manner, the change in visual states of each liquid crystal layer will be cumulative thereby providing a sufficient overall change in visual appearance of the display between its activated and inactivated states. For the single layer display shown in FIG. 2A, liquid crystal layer 36 has a thickness of 1.5 to 2.0 microns and is preferably powered by applying a 4- to 5-volt field across layer 36. In the display shown in FIG. 2B, the liquid crystal layers are thin enough such that a field of 1.5 volts need only be applied across each layer to cause a change in visual states.

As shown in FIG. 2B, a graphics layer 30 is preferably printed on a label substrate 32 in the same manner as described above with respect to FIG. 2A. A first transparent electrode 42 is subsequently printed on graphics layer 30. On transparent electrode 32 is printed a first liquid crystal layer 44. A second transparent electrode 46 is printed on an opposite side of liquid crystal layer 44. A second liquid crystal layer 48 is printed on second transparent electrode 46, and a third transparent electrode 50 is printed on second liquid crystal layer 48. Tester display 20 may further include a third liquid crystal layer 52 printed on third transparent electrode 50 and a fourth transparent electrode 54 printed on third liquid crystal layer 52. A protective layer 56 may also be provided over the structure in the same manner as described above with respect to FIG. 2A. Because each liquid crystal layer in the structure shown will be activated at the same time, alternating transparent electrodes are preferably electrically coupled together such that only two electrical connectors 58 and 60 need to be provided for delivering power to activate the display.

As with the embodiment illustrated in FIG. 2A, the embodiment of the display 20 illustrated in FIG. 2B includes liquid crystal layers that are preferably formed of PLC or PDLC materials. Further, the transparent electrodes are preferably formed of a solution and processable conductive polymer. Such materials are relatively inexpensive and are particularly well-suited for printing the layers on a substrate or adjacent layer as is desirable for mass production of such tester displays.

As mentioned above, the battery testing circuit preferably utilizes a display 20 that is used solely for the purpose of displaying information to the consumer. To this end, a separate voltage discriminating circuit 70 compares the sensed open circuit voltage of the battery to generated reference values to determine whether the remaining cell capacity of the battery is fresh, good, or fully discharged. It will be appreciated by those skilled in the art that if additional display segments are provided, voltage discriminating circuit 70 would preferably classify the sensed open circuit voltage in additional classifications to correspond to the number of display segments.

Figure 3:
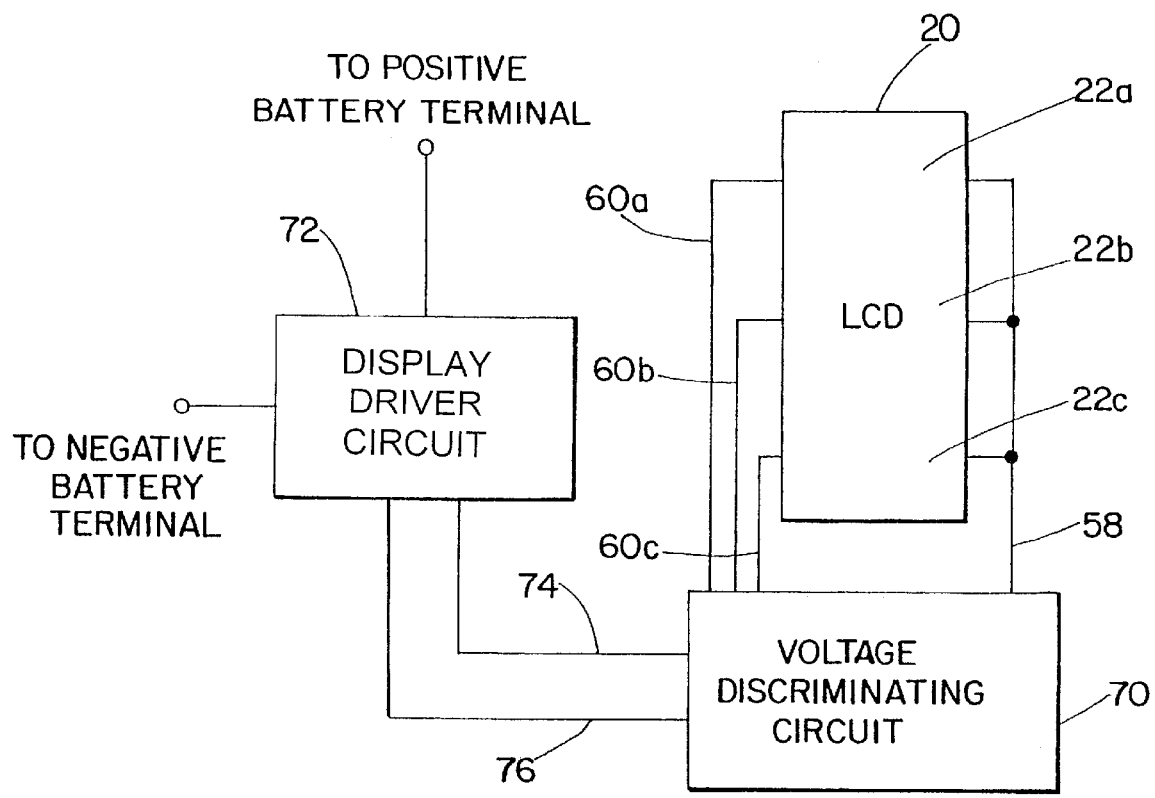
FIG. 3 is an electrical circuit diagram in block form of a battery tester circuit constructed in accordance with a first embodiment of the present invention.

Because the voltage required to drive liquid crystal display 20 may exceed that of the open circuit voltage of the battery, and because the electric field responsive-type liquid crystal displays described above are preferably driven using an alternating current (AC) signal rather than a direct current (DC) signal, a display driver circuit 72 is also included in the battery testing circuit of the present invention. As illustrated in FIG. 3, display driver circuit 72 is coupled to the positive and negative battery terminals by conductive strips 78 and 80, respectively. Display driver circuit 72 preferably delivers an AC driving signal over connectors 74 and 76 to voltage discriminating circuit 70. The frequency of the AC driving signal generated by circuit 72 is preferably less than 10 kHz. The voltage levels of circuit 72 are preferably in the range of 3 to 50 volts. Although FIG. 3 shows a provision of the display driver circuit 72 between the battery terminals and the voltage discriminating circuit 70, the positioning of these circuits may be reversed such that the voltage discriminating circuit 70 selectively enables display driver circuit 72 to deliver an AC driving signal to a selected segment (22a, 22b, or 22c) of display 20. However, by providing a display driver circuit 72 in the manner shown in FIG. 3, voltage discriminating circuit 70 will be presented with a greater range of voltages thereby increasing its ability to discriminate between various voltage levels. Exemplary circuits for implementing voltage discriminating circuit 70 and display driver circuit 72 are described below with reference to FIGS. 5 and 7. As explained below, circuits 70 and 72 are preferably formed by printing processable conductive polymer material layers on a battery label substrate. In this manner, a battery tester having such circuit components may be printed on a battery label.

Figure 4:
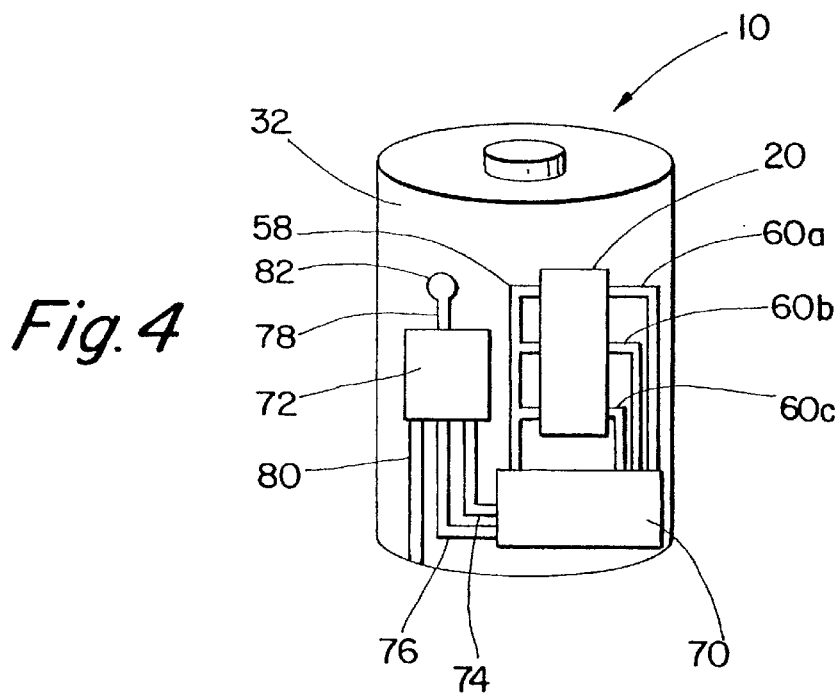
FIG. 4 is a perspective view of a battery constructed in accordance with a first embodiment of the present invention and having a protective outer layer removed to show the positioning of the elements on a base layer of a battery label.

FIG. 4 shows a battery 10 with protective layers (40 or 56) removed to expose the relative positioning of the components of the battery tester circuit as illustrated in FIG. 3. As shown in FIG. 4, conductive strip 80 extends along label substrate 32 to an edge thereof in contact with the negative terminal of battery 10. The negative terminal is typically electrically insulated from the battery can and positive terminal. Because the can is typically electrically connected to the positive terminal, conductive strip 78 need not extend all the way to the positive terminal at the end of battery 10, but may contact the battery can through a hole provided in label substrate 32. A switch pad 82 may optionally be provided over the hole in label substrate 32 such that the tester circuit may be selectively coupled to the positive terminal of the battery through activation of switch 82 by the consumer. Such a switch mechanism may be constructed in a conventional manner. With the preferred construction of the tester circuit of the present invention, however, conductive strip 78 may be permanently electrically connected to the can of battery 10 or to the positive terminal due to the very low power consumption rate of the preferred battery tester circuit. Thus, with such a direct and permanent electrical connection, the battery testing circuit may continuously monitor the cell capacity and provide a continuous display of the remaining capacity.

Figure 5:
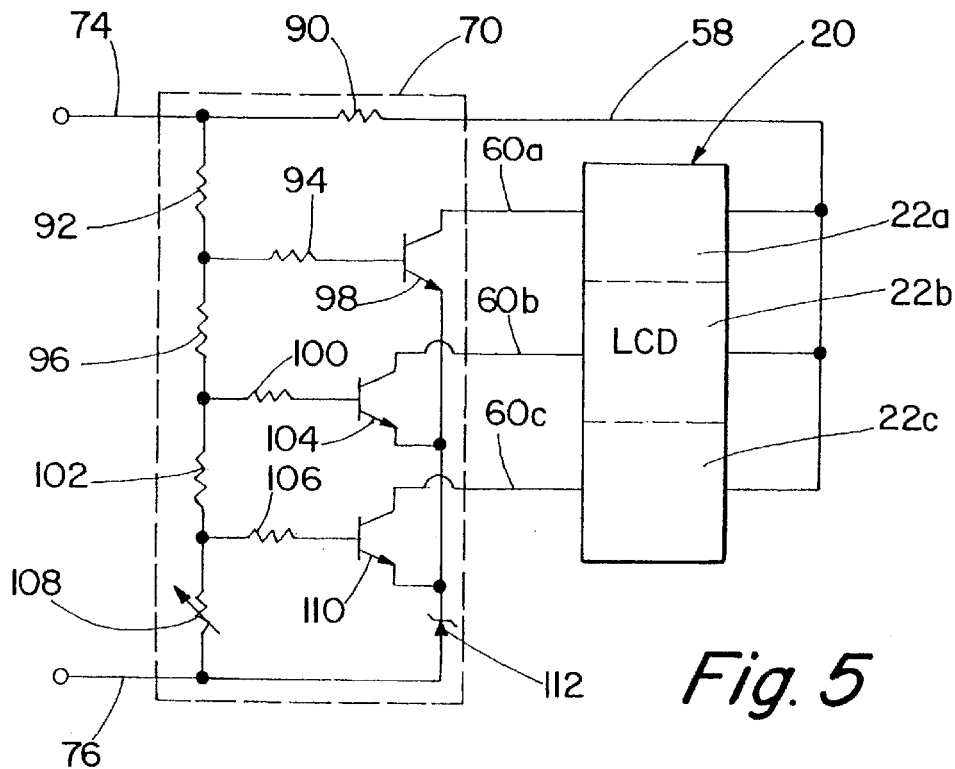
FIG. 5 is an electrical circuit diagram in block and schematic form showing an exemplary construction of a voltage discriminating circuit constructed in accordance with the present invention.

An exemplary circuit for implementing a voltage discriminating circuit 70 is shown in FIG. 5. As shown in FIG. 5, voltage discriminating circuit 70 may include a resistor dividing network including a first resistor 90 having a first end connected to connector 74 and a first end of a second resistor 92. As explained with respect to FIG. 3 above, connector 74 is coupled to the positive output terminal of display driver circuit 72. The second end of first resistor 90 is coupled to connector 58 which is coupled to one or more of the transparent electrodes that are part of liquid crystal display 20. Second resistor 92 has its second end connected to a first end of a third resistor 94 and to a first end of a fourth resistor 96. Third resistor 94 has its second end coupled to the gate of a first transistor 98. Fourth transistor 96 has its second end connected to a first end of a fifth resistor 100 and to the first end of a sixth resistor 102. Fifth resistor 100 preferably has its second end connected to the gate of a second transistor 104. Sixth resistor 102 preferably has its second end connected to a first end of a seventh resistor 106 and to a first end of a thermistor 108. Seventh resistor 106 preferably has its second end connected to the gate of a third transistor 110. The second end of thermistor 108 is preferably coupled to connector 76 and to the cathode of a Zener diode 112. The anode of Zener diode 112 is coupled to the drains of first, second, and third transistors 98, 104, and 110. The sources of transistors 98, 104, and 110 are respectively coupled to connector 60*a*, 60*b*, and 60*c* which drive the opposing transparent electrode in segments 22*a*, 22*b*, and 22*c*, respectively, of liquid crystal display 20.

The details and operation of the voltage discriminating circuit (70) illustrated in FIG. 5, are described in U.S. Pat. No. 4,027,231, the disclosure of which is incorporated herein by reference. Examples of other voltage discriminating circuits are disclosed in U.S. Pat. Nos. 5,460,902 and 5,610,511.

Voltage discriminating circuit 70 is preferably formed by printing the various elements and connectors directly on label substrate 32 or on protective layer 40 or 56. Techniques for printing resistors in this manner are known and used in printing thermochromic battery testers. Techniques for printing transistors and diodes using polymers are also generally known and described in an article by Francis Garnier et al., entitled "All-Polymer Field-Effect Transistor Realized by Printing Techniques" appearing in *Science,* Vol. 265, Sep. 16, 1994; and in an article by A. R. Brown et al. entitled "Logic Gates Made From Polymer Transistors and Their Uses in Ring Oscillators," *Science,* Vol. 270, Nov. 10, 1995. An example of a transistor printed using such polymers is shown in cross section in FIG. 6.

Figure 6:
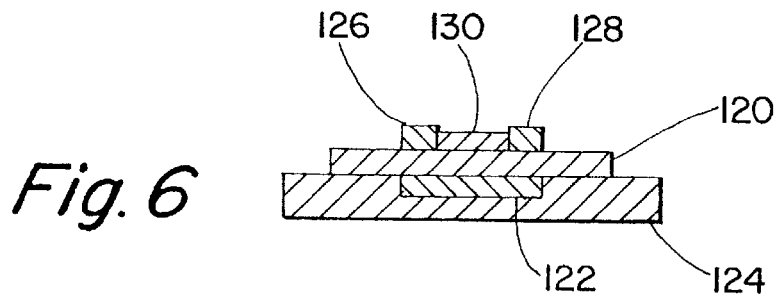
FIG. 6 is a cross-sectional view of an exemplary transistor that may be printed on a label using conductive and semi-conductive inks.

As shown in FIG. 6, a metal-insulator-semiconductor FET (MISFET) includes an insulating layer 120, which may be formed of a 1.5 $\mu$m thick polyester film polyethylene terephthalate. A gate electrode 122 may be printed on one of the faces of insulating film 120, a 10 $\mu$m thick layer of a conducting graphite-based polymer ink. The MISFET also includes a device substrate 124, which may be made of a 10×15 mm sized adhesive tape with electrical contact for the gate electrode made from the same conducting polymer ink. The source 126 and drain 128 layers of the MISFET may be formed using two 1×10 mm strips that are 10 $\mu$m layer thick of the same conducting graphite-based polymer ink. Preferably, the source and drain electrodes 126 and 128 are deposited through a mask with a 200 $\mu$m interelectrode distance. The MISFET further includes an organic semiconducting layer 130 deposited between the source and drain layers. Semiconducting layer 130 may be formed of $\alpha,\omega$-di(hexyl)sexithiophene.

Figure 7:
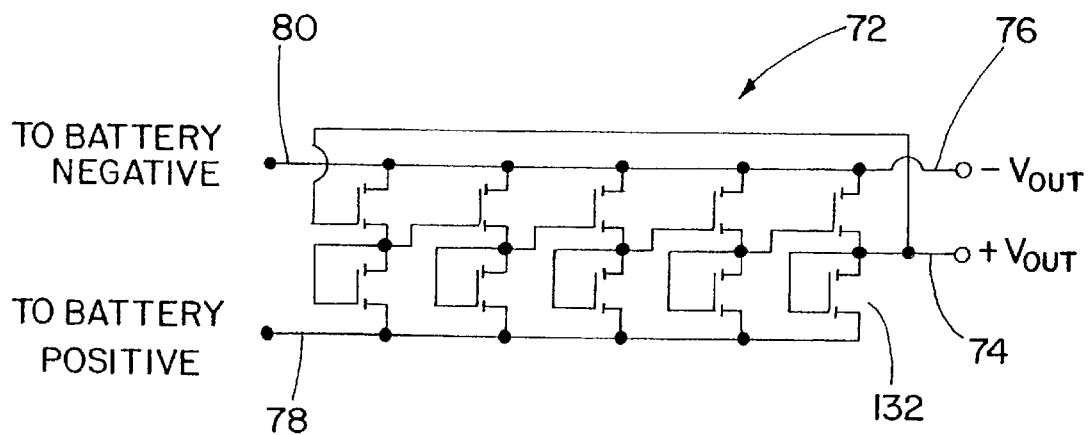
FIG. 7 is an electrical circuit diagram in schematic form illustrating an exemplary oscillating circuit for use in the battery tester circuit of the present invention.

FIG. 7 shows an exemplary display device circuit 72, including an oscillating circuit which may also be formed using polymer transistors suitable for printing on a substrate. The inverter ring oscillator shown in FIG. 7 is described by A. R. Brown et al. in an article entitled "Logic Gates Made From Polymer Transistors and Their Uses in Ring Oscillators," *Science,* Vol. 270, Nov. 10, 1995. As shown, this ring oscillator includes five inverter gates formed of a plurality of MISFETs 132. As described in the above article, the oscillator circuit shown in FIG. 7 has an oscillating frequency in the range of 10–500 Hz. MISFETs 132 may be printed and configured in the same manner as shown in FIG. 6. Examples of capacitive voltage doubler circuits capable of producing an AC signal at double the input voltage are described in Maxim 1989 Integrated Circuits Data Book, pp. 6–119; and in F. Mazda, Electronic Engineer's Reference Book, 5th Ed., Butterworths, 1983, Chapters 39 and 42, the disclosures of which are incorporated herein by reference.

Figure 8:
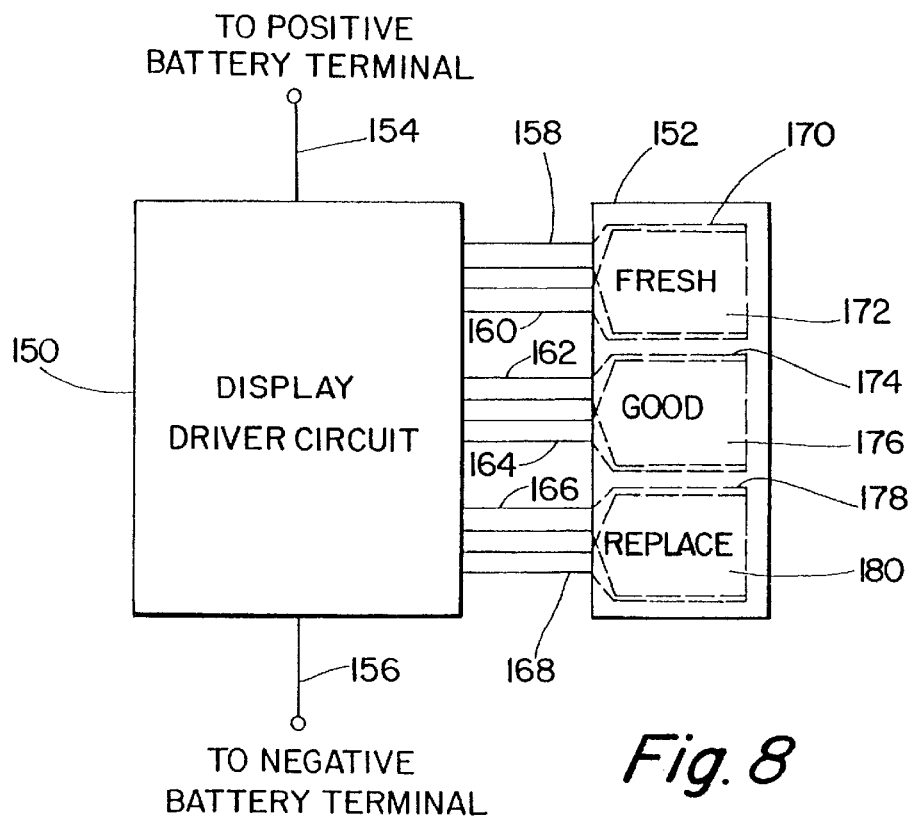
FIG. 8 is an electrical circuit diagram in block form illustrating a battery tester circuit constructed in accordance with a second embodiment of the present invention.

FIG. 8 shows a second embodiment of the battery tester circuit of the present invention. As shown, the tester circuit according to the second embodiment includes a display driver circuit 150 for generating an oscillating driving signal that is delivered to respective pairs of conductive strips 158, 160, 162, 164, 166, and 168 to respective electrodes 170, 172, 174, 176, 178, and 180 of a multi-segmented liquid crystal display 152. Display driver circuit 150 is connected to the positive battery terminal by a conductive strip 154 and to the negative battery terminal by a conductive strip 156. As apparent from a comparison of the tester circuit shown in FIG. 8 to that shown in FIG. 3, the voltage discriminating circuit 70 has been eliminated. In this regard, the voltage discrimination function is carried out by the liquid crystal display 152. Because the liquid crystal material changes between its optical states through a range of voltages, the voltages applied to display 152 may be appropriately adjusted through the use of resistors and display driver circuit 150 to correspond to the transition voltages that cause liquid crystal display 20 to change visual states. Also, by including different resistances connected to conductors 158, 162, and 166, some level of voltage discrimination may be transferred to display driver circuit 150 for actuating different segments of a multi-segmented display. In other words, the voltages applied to the three segments shown may be scaled so that only one segment of the liquid crystal display is activated at any one time.

Figure 9:
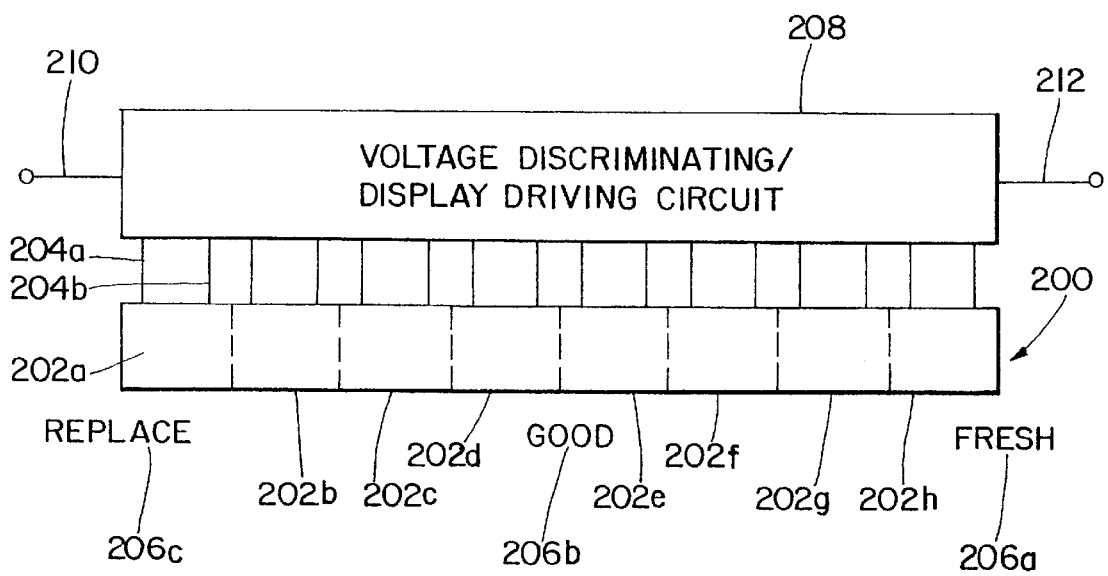
FIG. 9 is an electrical circuit diagram in block form illustrating a battery tester constructed in accordance with a third embodiment of the present invention.

FIG. 9 shows a third embodiment of the battery testing circuit of the present invention. As shown in FIG. 9, a display 200 is provided that includes many segments 202*a*–202*h* to provide a graduated scale to provide a more accurate discharge level indication ranging between "fresh," "good," and "replace" as designated by indicia 206*a*–206*c*, respectively. Each segment 202*a*–202*h* is driven by a voltage discriminating/display driving circuit 208 via a pair of conductive strips 204*a* and 204*b* provided for each segment. Voltage discriminating/display driving circuit 208 is coupled to the battery positive terminal by a conductive strip 210 and to the negative terminal by a conductive strip 212. For a AA alkaline Zn-MnO$_2$ cell, for example, the open circuit voltage falls from around 1.55 volts to 1.05 volts. Thus, the voltage discriminating circuit is preferably configured to activate one or all the display segments for cell voltages at or above 1.50 volts, to activate two or all but one display segments at voltages between 1.40 and 1.49 volts, etc., to provide an indication representing a gradual change in cell discharge level.

Those skilled in the art will appreciate that various configurations and constructions may be used for the various circuit components without departing from the spirit and scope of the present invention.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the Doctrine of Equivalents.

The invention claimed is:

1. A battery tester circuit comprising:

a substrate;

a display printed on said substrate for displaying an indication of the level of discharge of a battery in response to an electrical display signal;

9 a display driver circuit electrically coupled to said display and to the battery for receiving power from the battery to drive said display; and a voltage discriminating circuit electrically coupled to said display and to the battery for sensing a discharge level of the battery and for supplying an electrical display signal representing the sensed discharge level to said display, wherein at least one of said circuits is printed on said substrate at a location spaced apart from said display and is coupled to said display by a conductor.

2. The battery tester circuit as defined in claim 1, wherein said voltage discriminating circuit is directly coupled to opposite terminals of the battery for continuously monitoring the discharge level of the battery and said display continuously displays an indication of the sensed discharge level.

3. The battery tester circuit as defined in claim 1, wherein both of said circuits are printed on said substrate.

4. The battery tester circuit as defined in claim 1, wherein said display is an electric field-responsive liquid crystal display.

5. The battery tester circuit as defined in claim 4, wherein said liquid crystal display is made of a polymer dispersed liquid crystal material.

6. The battery tester circuit as defined in claim 4, wherein said liquid crystal display is made of a polymer liquid crystal material.

7. The battery tester circuit as defined in claim 1, wherein said display driver circuit is an oscillator circuit.

8. The battery tester circuit as defined in claim 1, wherein said substrate is a battery label.

9. The battery tester circuit as defined in claim 1, wherein said substrate is a housing for at least one electrochemical cell.

10. A battery testing circuit comprising:

a liquid crystal display component for displaying a level of discharge of a battery; and an oscillator circuit component coupled to said liquid crystal display component and to the battery for receiving power therefrom to drive said liquid crystal display component, wherein both of said components are printed on a substrate.

11. The battery testing circuit as defined in claim 10, wherein said liquid crystal display component is made of a polymer dispersed liquid crystal material.

12. The battery testing circuit as defined in claim 10, wherein said liquid crystal display component is made of a polymer liquid crystal material.

13. The battery testing circuit as defined in claim 10, wherein the substrate is a battery label.

14. A battery label comprising:

a label substrate for covering an outer portion of a battery; and a printed electric field-responsive bipolar liquid crystal display printed on an outer surface of said label substrate for displaying information pertaining to the battery; and a display driver circuit printed on said label substrate and coupled to said liquid crystal display and to the battery for receiving power from the battery to drive said liquid crystal display.

15. The battery label as defined in claim 14, wherein said liquid crystal display includes:

a first electrode printed on said label substrate;

10 a liquid crystal layer printed on said first electrode; and a second electrode printed on said liquid crystal layer.

16. The battery label as defined in claim 15, wherein said second electrode is made of a transparent processable conductive polymer.

17. The battery label as defined in claim 14, wherein said liquid crystal display includes:

a first electrode printed on said label substrate;

a first liquid crystal layer printed on said first electrode;

a second electrode printed on said first liquid crystal layer;

a second liquid crystal layer printed on said second electrode; and a third electrode printed on said second liquid crystal layer.

18. The battery label as defined in claim 17, wherein said liquid crystal display further includes:

a third liquid crystal layer printed on said third electrode; and a fourth electrode printed on said third liquid crystal layer.

19. The battery label as defined in claim 14, wherein said display driver circuit is an oscillator circuit.

20. The battery label as defined in claim 14, wherein said liquid crystal display displays an indication of the battery discharge level.

21. The battery label as defined in claim 20, wherein said liquid crystal display is responsive to an open circuit voltage of the battery to change a visual appearance thereby displaying an indication of the relative discharge level of the battery.

22. The battery label as defined in claim 20 and further including a voltage discriminating circuit printed on said label substrate and coupled to the battery for providing an indication of the battery discharge level to said liquid crystal display.

23. The battery label as defined in claim 14, wherein said liquid crystal display continuously displays an indication of the relative battery discharge level.

24. The battery label as defined in claim 14, wherein said liquid crystal display is made of a polymer dispersed liquid crystal material.

25. The battery label as defined in claim 14, wherein said liquid crystal display is made of a polymer liquid crystal material.

26. The battery label as defined in claim 14, wherein said liquid crystal display includes:

a first display segment printed on said label substrate;

a second display segment printed on said label substrate; and a display driver circuit coupled to said first and second display segments for separately applying an electric field across each of said first and second display segments.

27. A battery label comprising:

a label substrate for covering an outer portion of a battery;

a printed electric field-responsive liquid crystal display printed on an outer surface of said label substrate for displaying information pertaining to the battery, wherein said liquid crystal display includes a plurality of display segments printed on said label substrate; and a display driver circuit printed on said label substrate and coupled to said display segments for separately applying an electric field across each of said display segments.

28. The battery label as defined in claim 27, wherein each of said display segments includes a first electrode printed on said label substrate, a liquid crystal layer printed on the first electrode and a second electrode printed on said liquid crystal layer.

29. The battery label as defined in claim 28, wherein said liquid crystal layer is a common layer to all of said plurality of display segments.

30. The battery label as defined in claim 28, wherein said liquid crystal layer is made of a polymer dispersed liquid crystal material.

31. The battery label as defined in claim 28, wherein said liquid crystal layer is made of a polymer liquid crystal material.

32. The battery label as defined in claim 27, wherein said liquid crystal display displays an indication of the battery discharge level.

33. The battery label as defined in claim 27, wherein said display driver circuit selectively applies an electric field to one or more of said display segments to indicate a relative discharge level of the battery.

34. The battery tester circuit as defined in claim 1, wherein said display is a bipolar liquid crystal display.

35. The battery tester circuit as defined in claim 1, wherein said display is a birefringent liquid crystal display.

36. The battery testing circuit as defined in claim 10, wherein said display component is a bipolar liquid crystal display.

37. The battery testing circuit as defined in claim 10, wherein said display component is a birefringent liquid crystal display.

38. The battery label as defined in claim 27, wherein said printed liquid crystal display is a bipolar liquid crystal display.

39. The battery label as defined in claim 27, wherein said printed liquid crystal display is a birefringent liquid crystal display.

40. A battery label comprising:

a label substrate for covering an outer portion of a battery; and a printed electric field-responsive birefringent liquid crystal display printed on an outer surface of said label substrate for displaying information pertaining to the battery; and a display driver circuit printed on said label substrate and coupled to said liquid crystal display and to the battery for receiving power from the battery to drive said liquid crystal display.

41. The battery tester circuit as defined in claim 1, wherein at least one of said circuits includes discrete, interconnected electronic components.

42. The battery tester circuit as defined in claim 1, wherein said display driver circuit is printed on said substrate.

* * * * *